(12) United States Patent
Andreou et al.

(10) Patent No.: US 12,288,963 B2
(45) Date of Patent: Apr. 29, 2025

(54) MONOLITHICALLY INTEGRATED InP ELECTRO-OPTICALLY TUNABLE RING LASER, A LASER DEVICE AS WELL AS A CORRESPONDING METHOD

(71) Applicant: SMART PHOTONICS HOLDING B.V., Eindhoven (NL)

(72) Inventors: Stefanos Andreou, Eindhoven (NL); Erwin Antonius Josephus Maria Bente, Nuenen (NL)

(73) Assignee: SMART PHOTONICS HOLDING B.V., Eindhoven (NL)

( * ) Notice: Subject to any disclaimer, the term of this patent is extended or adjusted under 35 U.S.C. 154(b) by 570 days.

(21) Appl. No.: 17/679,060

(22) Filed: Feb. 23, 2022

(65) Prior Publication Data

US 2022/0216672 A1    Jul. 7, 2022

Related U.S. Application Data

(63) Continuation of application No. PCT/EP2020/074473, filed on Sep. 2, 2020.

(30) Foreign Application Priority Data

Sep. 2, 2019 (EP) .................................. 19194969

(51) Int. Cl.
*H01S 5/10*  (2021.01)
*H01S 5/026*  (2006.01)
(Continued)

(52) U.S. Cl.
CPC .......... *H01S 5/1071* (2013.01); *H01S 5/0265* (2013.01); *H01S 5/1028* (2013.01); *H01S 5/34313* (2013.01); *H01S 5/50* (2013.01)

(58) Field of Classification Search
CPC .... H01S 5/1071; H01S 5/0265; H01S 5/1028; H01S 5/34313; H01S 5/50; H01S 3/1063;
(Continued)

(56) References Cited

U.S. PATENT DOCUMENTS 9,537,289 B1 * 1/2017 Akiyama ................ H01S 5/142
9,551,832 B1 * 1/2017 Bovington ......... G02B 6/12007
(Continued)

FOREIGN PATENT DOCUMENTS

EP         2645496 A1   10/2013
JP       2008066318 A    3/2008
(Continued)

OTHER PUBLICATIONS

Pajkovic et al., "Tuning of a widely tunable monolithically integrated InP laser for optical coherence tomography", Proceedings of SPIE, ISSN 0277-786X, SPIE, US, vol. 10939, Mar. 1, 2019 (Mar. 1, 2019), pp. 1093912-1-1093912-8 (Year: 2019).*
(Continued)

*Primary Examiner* — Xinning (Tom) Niu
(74) *Attorney, Agent, or Firm* — EIP US LLP

(57) ABSTRACT

A tuneable ring laser having a ring cavity, wherein the ring cavity comprises at least one ring resonator having a waveguide for guiding waves, a phase modulator having a waveguide for guiding waves, one or more power couplers for coupling the waves in, and out of, the at least one ring resonator, wherein a cross section of the waveguides of the at least one ring resonator and the phase modulator is configured as PIN diodes and act as an electro-refractive modulator such that the tuneable ring laser is tuneable by applying a reverse bias voltage.

17 Claims, 1 Drawing Sheet

(51) Int. Cl.
*H01S 5/343* (2006.01)
*H01S 5/50* (2006.01)

(58) Field of Classification Search
CPC ........ H01S 5/0287; H01S 5/026; H01S 5/142; H01S 5/1032
See application file for complete search history.

(56) References Cited

U.S. PATENT DOCUMENTS

| | | | |
|---|---|---|---|
| 2002/0037023 A1* | 3/2002 | Margalit | H01S 5/1071 372/50.1 |
| 2003/0219045 A1 | 11/2003 | Orenstein et al. | |
| 2009/0046748 A1* | 2/2009 | Kato | H01S 5/026 372/20 |
| 2009/0059973 A1* | 3/2009 | Suzuki | H01S 5/1032 372/20 |
| 2010/0266232 A1* | 10/2010 | Lipson | G02F 1/025 385/2 |
| 2011/0310918 A1* | 12/2011 | Yoon | H01S 5/0265 372/99 |

FOREIGN PATENT DOCUMENTS

| | | |
|---|---|---|
| JP | 2008268276 A | 11/2008 |
| JP | 2009049064 A | 3/2009 |
| JP | 2013093627 A | 5/2013 |
| JP | 2016139741 A | 8/2016 |
| JP | 2018010047 A | 1/2018 |
| KR | 1020060094224 A | 8/2006 |

OTHER PUBLICATIONS

International Search Report and Written Opinion dated Nov. 20, 2020, for PCT Application No. PCT/EP2020/074473.

Pajkovic et al., "Tuning of a widely tunable monolithically integrated InP laser for optical coherence tomography", Proceedings of SPIE, ISSN 0277-786X, SPIE, US, vol. 10939, Mar. 1, 2019 (Mar. 1, 2019), pp. 1093912-1093912, XP060117684, DOI: 10.1117/12.2509572.

Cho et al., "Unidirectionality of semiconductor ring lasers: theory and experiment", 2002 IEEE 18th, International Semiconductor Laser Conference, Garmisch, Germany, Sep. 29-Oct. 3, 2002; IEEE International Semiconductor Laser Conference, New York, NY: IEEE, US, vol. Con F. 18, Sep. 29, 2002 (Sep. 29, 2002), pp. 69-70, XP010609167, DOI: 10.1109/ISLC.2002.1041122, ISBN: 978-0-7803-7598-7.

Andreou et al., "Electro-Optic Tuning of a Monolithically Integrated Widely Tuneable InP Laser With Free-Running and Stabilized Operation", Journal of Lightwave Technology, IEEE, USA, vol. 38, No. 7, Nov. 8, 2019 (Nov. 8, 2019), pp. 1887-1894, XP011782174, ISSN: 0733-8724, DOI: 10.1109/JLT.2019.2952466.

Japanese Office Action dated May 7, 2024 for Japanese Patent Application No. 2022-513565.

Latkowski et al., "Novel Widely Tunable Monolithically Integrated Laser Source", IEEE Photonics Journal, vol. 7, No. 6, Dec. 1, 2015.

Japanese Office Action Notice of Refusal dated Oct. 24, 2024 for Japanese Patent Application No. 2022-513565.

* cited by examiner

MONOLITHICALLY INTEGRATED InP ELECTRO-OPTICALLY TUNABLE RING LASER, A LASER DEVICE AS WELL AS A CORRESPONDING METHOD

CROSS-REFERENCE TO RELATED APPLICATIONS

This application is a continuation of International Application No. PCT/EP2020/074473, filed Sep. 2, 2020 which claims priority to European Application No. EP 19194969.2, filed Sep. 2, 2019, under 35 U.S.C. § 119(a). Each of the above referenced patent applications is incorporated by reference in its entirety.

BACKGROUND

Field of the Invention

Widely tuneable laser sources with narrow linewidths play a key role in high-speed communications, sensing, spectroscopy, quantum optics and light detection and raging application. For example, in coherent optical communication systems, a 16 quadrature amplitude modulation, QAM, at 40 Gb/s, a linewidth of 120 kHz is required while upscaling to 64 QAM yields a hundred times more stringent requirements on the laser linewidth.

Active stabilization schemes have been proposed to improve the linewidth and frequency noise properties of free-running lasers. This approach is more common in spectroscopy and sensing applications. The most widely used and powerful technique is the Pound-Drever-Hall, PDH, frequency locking. In this technique, a laser is locked to an external optical cavity by using negative electrical feedback. In the case of diode lasers, two control signals are typically used; one on the semiconductor optical amplifier, SOA, and an external acousto-optic modulator. In a known approach which allows the implementation of PDH locking using a single control loop, limited only by the loop delay is demonstrated. This approach deploys a bulk lithium niobite single side-band modulator with bandwidth up to 5 MHz.

Much effort has been put in recent years towards reducing the linewidth of chip-based integrated lasers from several MHz to the 100 kHz range and below. Different integration strategies have been followed to achieve this goal. For example, monolithically integrated tuneable distributed Bragg reflector, DBR, lasers with 50-100 kHz intrinsic linewidth have been demonstrated. The mirrors were sampled and super-mode DBR gratings that were thermally tuned. Tuneable lasers based on current injection tuning have also been reported in the past. However, due to the known linewidth broadening mechanism of the current injection such DBRs are not suited for applications which require very low linewidths.

Following the above, the present disclosure is directed to the realization of a single-mode longitudinal wave unidirectional ring laser which offers tuneability over a full band, which is typically used for telecommunications but not limited to this particular field. The tuning of the proposed laser does not significantly disturb/broaden the intrinsic linewidth of the lasing mode, making the linewidth performance independent of the lasing wavelength within the tuning range.

SUMMARY

It would be advantageous to achieve a ring laser that can be tuned over a particularly broad frequency band, and wherein the tuning does not, or hardly, influence the intrinsic linewidth of the lasing mode.

In a first aspect of the disclosure, there is provided a tuneable ring laser, for example a monolithically integrated, InP, tuneable ring laser, having a ring cavity, wherein the ring cavity comprises:
  at least one ring resonator having a waveguide for guiding waves,
  a phase modulator having a waveguide for guiding waves,
  a power coupler for coupling the waves in, and out of, the at least one ring resonator
  wherein a cross section of the waveguides of the at least one ring resonator and the phase modulator is configured as PIN diodes and act as an electro-refractive modulator such that the tuneable ring laser is tuneable by applying a reverse bias voltage.

The presented ring laser can, for example, operate around a wavelength of between 1500 nm to 1650 nm, for example 1550 nanometers. Such wavelengths are especially suitable for telecommunication applications. The laser is, however, in accordance with the disclosure is, however, not limited to such a specific technical field.

Using the presented ring laser, it is possible to tune the lasing peak over a range of, for example, more than 30 nm. Such a single peak may be achieved by the superposition of three filters, i.e. two ring resonators as well as the ring cavity itself. The combination of these filters may suppress the peaks, i.e. modes, except for the lasing mode.

The tuning of the laser in accordance with the disclosure is based on applying negative voltages, i.e. reverse bias, on the tuning sections of the laser, i.e. the resonator and the phase modulator. This is different compared to other principles of tuning such as thermal tuning or forwards bias, i.e. positive voltages, because it results in lower power consumption, does not disturb the width of the lasing peak and can be faster because no slow transient effects take place like heat dissipation. Furthermore, the use of the ring resonators offer additional reduction to the width of the lasing peak.

In prior art, the tuning may be performed using heat elements. A heat element causes the optical path length of the resonator to increase, or decrease. In accordance with the disclosure, the at least one ring resonator is tuned by applying a reverse bias voltage. Applying a reverse bias voltage may change the path length, as well as the intrinsic properties of the material itself. This is caused by multiple factors, one of which is of linear and quadratic electro-optic effects, Pockets and Kerr effect respectively.

The power coupler is used for coupling the waves in, and out of, the at least one ring resonator. The power coupler may be a multimode interference coupler with, for example, a 50% splitting ratio. Another option is that the ring resonator is placed physically close to the ring cavity itself, such that a coupling effect occurs based on the geometry of the cavity/ring resonator.

Preferably, the monolithically integrated ring cavity comprises two ring resonators.

In a further example, the ring laser further comprises a broadband reflector which is arranged to couple emission in a first propagation mode, for example clock-wise propagation mode, to a second propagation mode configured opposite the first propagation mode, for example anti clock-wise propagation mode.

The above ensures that the propagation direction of the waves in the ring laser is unidirectional.

In yet another example, the cavity further comprises a semiconductor optical amplifier, SOA, arranged for amplifying the waves in the cavity.

A semiconductor optical amplifier is, for example, an optical amplifier based on a semiconductor gain medium. It may look like a laser diode where the end mirrors have been replaced with anti-reflection coatings.

It is noted that the semiconductor optical amplifier, SOA, may comprise InGaAsP multi-quantum-well based material.

Following the above, the disclosure may be directed to a monolithically integrated unidirectional single mode ring laser. The laser may be fabricated using a commercially available InP-based integration technology in the framework of multi-project wafer runs. The Vernier effect of the transmission spectrum of two ring resonators may be used with slightly different circumference to select the lasing mode. The two ring resonators can be tuned in reverse bias operation by deploying mostly voltage-controlled electro-optic effects.

The tuneable laser in accordance with the present disclosure may also be fabricated using silicon technology, wherein the modulators, as well as the semiconductor optical amplifier, may be integrated on top of silicon waveguides using bonding techniques. In such implementation, the mode may travel from silicon waveguides to the InP waveguide which is a phase modulator, and then back down to silicon again.

Due to the reverse bias operation this tuning mechanism avoids significant on-chip heat dissipation, unlike thermal tuning, and at the same time does not increase the linewidth of the laser. This is in contrast with current injection tuning which is well-known to cause significant linewidth broadening as well as significant heat dissipation. The ring resonators also aids in the linewidth reduction since they increase the effective length of the cavity. In general, ring lasers may suffer from directionality problems. Here, however the unidirectional operation of the laser may be ensured by a broadband reflector which couples the anticlock-wise propagation mode to the clock-wise mode, or vice versa.

This mirror may not have a high-reflectivity coated facet but a multi-mode interference reflection which can be placed right at one of the two output ports of the laser. Effectively, the unidirectional laser can then be placed anywhere in the die/chip not necessarily being connected to a reflective facet.

In a further example, any of the waveguides is an etched ridge waveguide, wherein a cross-section of the etched ridge waveguide is a vertical PIN diode and acts as an electro-refractive modulator, ERM.

In a further example, the ring cavity comprises two ring resonators with different radii.

The radii of the two ring resonators may, for example, be 120 μm and 123 μm long, or anything comparable. The resulting difference in path length may then be equal to about 18.85 μm. The two ring resonators may be implemented using 2×1 multimode interference, MMI, couplers with, for example, 50% splitting ratio. The total circumference of one ring resonator, including the length of the MMIs, may be 1.400 mm and the second may be 18.85 μm longer. This configuration yields a Vernier FSR of about 35 nm.

In a second aspect of the present disclosure, there is provided a laser device for emitting a laser beam, wherein the laser device comprises a tuneable ring laser in accordance with the present disclosure.

The laser device may, for example, be a telecommunication device that is equipped with a laser, i.e. a telecommunication device that is used for optical communication using optical fibres. The telecommunication device may, for example, be a modem or the like.

It is further noted that the advantages as explained with respect to the first aspect of the present disclosure, being the tuneable ring laser, are also applicable to the second aspect of the present disclosure, being the laser device.

In a third aspect of the present disclosure, there is provided a method of operating a tuneable ring laser in accordance with any of the previous claims, wherein the method comprises the steps of:
coupling, by the one or more power couples, waves in the at least one ring resonator;
guiding, by the at least one ring resonator and the phase modulator, waves via their respective waveguide,
applying, to the PIN diodes of any of the waveguides, the reverse bias voltage to thereby tune the tuneable ring laser.

It is noted that the reverse bias voltage may be applied to the PIN diodes of any of the waveguides using a voltage control device. The voltage control device may have two output terminals, wherein a first of the two output terminals is connected to the P-type semiconductor region of a PIN diode and the second of the two output terminals is connected to the N-type semiconductor region of a PIN diode.

It is further noted that the advantages as disclosed with respect to the first aspect of the present disclosure, being the tuneable ring laser, are also applicable to the third aspect of the present disclosure, being the method of operating the tuneable ring laser.

In an example of the above described method, the ring cavity comprises two ring resonators.

In a further example, the cavity comprises a semiconductor optical amplifier, SOA, and wherein the method further comprises the step of:
amplifying, by the SOA, the waves in the cavity.

In another example, the SOA comprising InGaAsP multi-quantum-well based material.

These and other aspects of the invention will be apparent from and elucidated with reference to the embodiment(s) described hereinafter.

DETAILED DESCRIPTION

Figure 1:
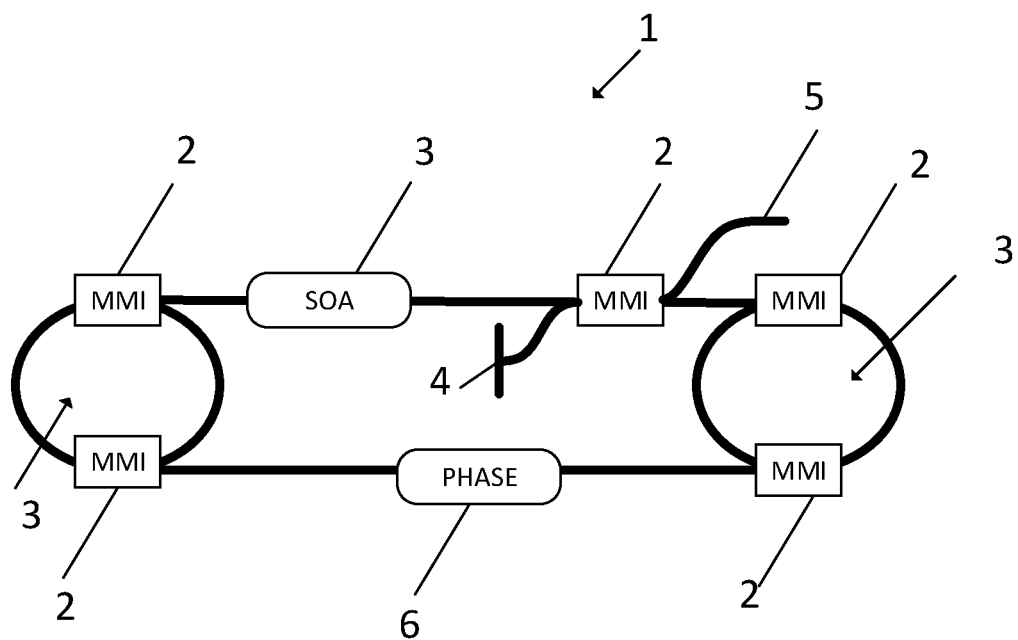
FIG. 1 shows a ring laser in accordance with the present disclosure.

FIG. 1 shows a ring laser 1 in accordance with the present disclosure.

The tuneable ring laser 1 is a tuneable ring laser, monolithically integrated on Indium phosphide, InP, InP is a binary semiconductor composed of indium and phosphorus. It has a zincblende crystal structure, comparable to that of GaAs and most of the III-V semiconductors. The inventors have found that a semiconductor double heterostructure InP (p-doped)-InGaAsP (intrinsic)-InP (n-doped) is especially suitable to be used in case a reverse bias is to be applied for tuning the ring laser.

The tuneable ring laser 1 has a ring cavity which comprises two ring resonators 3 for guiding waves. As shown in FIG. 1, the tuneable ring laser 1 has two horizontally oriented waveguides which are substantially parallel to each other. These horizontally oriented waveguides are connected to each other via the ring resonators 3.

The ring resonators 3 resemble PIN diodes and act as an electro-refractive modulator such that the tuneable ring laser can be tuned, in frequency, by applying a reverse bias voltage.

In the context of the present disclosure, a PIN diode is a diode with a wide, undoped intrinsic semiconductor region between a p-type semiconductor and an n-type semiconductor region.

The wide intrinsic region, i.e. the "i"-region, is in contrast to an ordinary p-n diode. The wide intrinsic region makes the PIN diode suitable for guiding light. The "i"-region makes it possible to tune the ring laser by applying a reverse bias voltage. The reverse bias voltage amends, amongst other, the amount of free carriers in the PIN medium, thereby effectively changing the frequency properties of the ring laser 1.

One of the reasons for using a PIN diode is that it may be undesirable that the optical mode has a large overlap with the p-doped region. Using a PN diode, the overlap will be unavoidably large. Furthermore, if there is an intrinsic region in which the optical mode is guided, then the optical mode may have a large overlap with the region in which electro-optic effects happen therefore increasing its efficiency.

The monolithically integrated InP tuneable ring laser 1 further comprises a phase modulator 6. The phase modulator may also be controlled by applying a reverse bias voltage.

One or more power couplers 2 may be provided for coupling the waves in, and out of, the at least one ring resonator 3. Further, the cavity further comprises a semiconductor optical amplifier, SOA, 3 arranged for amplifying the waves in the cavity.

Even further, the ring laser further comprises a broadband reflector 4 which is arranged to couple emission in a first propagation mode, for example clock-wise propagation mode, to a second propagation mode configured opposite the first propagation mode, for example anti clock-wise propagation mode. The output of the laser is indicated with reference numeral 5.

The phase modulator tuning mechanism that is proposed in this disclosure may be based on a reverse biased PIN structure in the corresponding waveguide. It differs from the usual electronic current injection based or thermal heating in the prior art. The presented ring laser avoids significant on-chip heat dissipation. It is shown that reverse biasing the phase sections results in values for the heat dissipation <100 μW at 8 V bias. This is a significantly lower power level than that required for thermal tuning mechanisms for a filter, e.g. DBR section, which typically need several 10s of mW. The origin of the heat dissipation the phase modulators used is the reverse bias current due to the carrier depletion in the intrinsic region which increases at higher voltages.

The proposed tuning mechanism can also enable faster tuning compared to thermal tuning due to the weaker slow transient thermal effects which are involved.

Furthermore, contrary to current injection tuning no significant propagation losses due to free-carrier absorption takes place. Low additional propagation losses occur only at high voltages due to electro-absorption. In fact, at low voltages (<5 V) losses are even slightly reduced due to free-carriers depletion.

The disclosure is directed to an unidirectional single mode ring laser monolithically integrated on InP. The laser deploys the Vernier effect from, for example, two periodical spectral filters for its single-mode operation and it is tuned using voltage controlled electro-optic effects.

In a specific embodiment of the ring laser, two ring resonators with slightly different circumference are utilized to increase the Free Spectral Range, FSR, of the filter and to select a single lasing mode within the modal gain bandwidth. The enhanced FSR from the Vernier effect may be calculated by:

$$\Delta\lambda_{FSR,Vernier} = \frac{\Delta\lambda_{FSB1}\Delta\lambda_{FSR2}}{\Delta\lambda_{FSR1} - \Delta\lambda_{FSR2}}$$

Here, $\Delta\lambda_{FSR1}$ and $\Delta\lambda_{FSR2}$ are the FSR of the individual ring resonators. The FSR of an individual ring resonator is given by $\Delta\lambda_{FSR} = \lambda^2/n_g L$, where $n_g$ is the group index, L the circumference of a single ring and $\lambda$ the wavelength. The detuning of the two rings may be large enough such that the tuning range is limited by the modal gain bandwidth of the SOA and not the FSR of the Vernier intra-cavity filter.

The laser was designed using a component library of a commercially available active-passive InP-based integration technology. The ring cavity may include a 1 mm long SOA with InGaAs multi-quantum-well based material. The SOA is based on a shallow etched ridge waveguide. The radii of the two rings may be 120 μm and 123 μm. The resulting difference in path length is 18.85 μm. The two ring resonators are implemented using 2×1 multimode interference (MMI) couplers with 50% splitting ratio. The total circumference of one ring resonator, including the length of the MMIs, is 1.400 mm and the second is 18.85 μm longer.

This configuration yields a Vernier FSR of about 35 nm. This FSR ensures that the laser tuning range is larger than 30 nm therefore covering the span of a single band and does not compromise single mode operation. A 0.4 mm long electro-optic phase modulator section is also included in the laser cavity to facilitate independent tuning the cavity modes. The phase section can be used to keep the lasing mode aligned with the transmission maximum of the two ring filters to prevent mode-hopping of the laser.

The two ring resonators and the phase section can be tuned by applying a reverse bias voltage. They are all deeply etched ridge waveguides, their cross-section is a vertical PIN diode and act as electro-refractive modulators (ERM). The non-intentionally doped guiding layer is bulk InGaAsP quaternary material with bandgap at 1.25 μm. The effective refractive index changes are a result of both field (Pockels and Kerr) and carrier (plasma/carrier depletion and band-filling) effects. The addition of these effects results in a modulator efficiency of about 15°/Vmm for TE polarized light.

The power out-coupling is implemented by a 2×2 MMI with 85-15 splitting ratio. The out-coupling power percentage is 15%. The unidirectional operation of the ring laser is ensured by an extra-cavity broadband reflector which couples the amplified spontaneous emission (ASE) in the anti-clock-wise propagation mode to the clock-wise mode. The broadband reflector is a multi-mode interference reflector.

The total length of the cavity is 5.9 mm corresponding to a cavity mode free-spectral range (FSR) of 13.5 GHz (0.108 nm).

The spacing of the cavity modes and the ring filter modes is such that a cavity mode falls within a ring filter transmission peak every $4 \times \Delta\lambda_{FSR}$. Effectively the cavity modes within this $4 \times \Delta\lambda_{FSR}$ range are suppressed by the ring filters. The gain difference between the lasing mode and the neighbouring cavity mode falling within a ring resonator transmission peak (which is $4 \times \Delta\lambda_{FSR}$ away) is about 8%. This transmission difference is adequate to ensure single mode operation of the laser.

Figure 2:
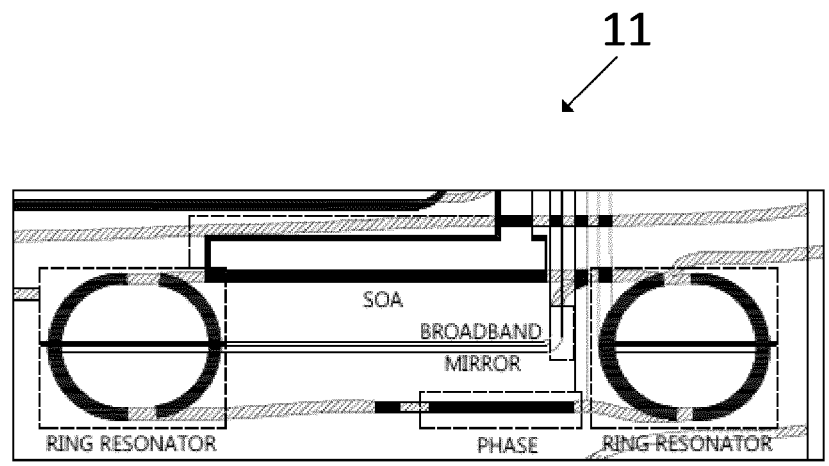
FIG. 2 shows a Microscope image of the ring laser in accordance with the present disclosure.

FIG. 2 shows a Microscope image 11 of the ring laser in accordance with the present disclosure.

The ring cavity may include a 1 mm long SOA with InGaAsP multi-quantum-well based material. The SOA may be based on a shallow etched ridge waveguide. The two ring resonators may have a radius of ~200 μm and the power coupling is implemented using 2×1 MultiMode Interference, (MMI) couplers with 50% splitting ratio.

The total circumference of a single ring resonator, including the length of the MMIs, is 1.4 mm and 1.419 mm. A 0.4 mm long electro-optic phase modulator section is also included in the laser cavity to facilitate independent tuning the cavity modes.

The two ring resonators and the phase section can be tuned by applying a reverse bias voltage. They are both deeply etched ridge waveguides, their cross-section is a vertical PIN diode and act as electro-refractive modulators, ERM.

The non-intentionally-doped guiding layer is bulk InGaAsP quaternary material with bandgap at 1.25 μm. The effective index changes are a result of both field, Pockels and Kerr, and carrier, plasma/carrier depletion and band-filling, effects. The addition of these effects results in a modulator efficiency of about 15°/Vmm for TE polarized light.

The power out-coupling is implemented by a 2×2 MMI with 85-15 splitting ratio. The out-coupling power percentage is 15%. The unidirectional operation of the ring laser is ensured by an extra-cavity broadband reflector which couples the amplified spontaneous emission, ASE, in the anti-clock-wise propagation mode to the clock-wise mode. The broadband reflector is a multi-mode interference reflector. The total length of the cavity is 5.9 mm corresponding to a cavity mode free-spectral range of 13.5 GHz, i.e. corresponding to 0.108 nm.

The laser shown in FIG. 2 was fabricated using a commercially available active-passive InP-based integration technology. A microscopic image of the laser is shown in FIG. 2. Its footprint is 2.17×0.56 mm2. The laser was characterized at 18° C. using a water-cooler based temperature stabilized mount. The waveguide from the laser output is angled with respect to the chip facet to suppress back-reflections to the laser cavity.

The chip facet was also coated with anti-reflection coating to further suppress back-reflections. The laser output light was coupled out of the chip using a single-mode lensed fibre. Typical coupling losses between the chip facet and the lensed fibre due to the mode mismatch are ~4 dB.

It is noted that, at low tuning voltages the dissipated tuning power is 2-3 orders of magnitude lower than other tuneable lasers which typically use thermo-optic tuning in order not to disturb the laser linewidth. On average the dissipated tuning power is at least an order of magnitude lower. Furthermore, the intra-cavity ring resonators help in decreasing the laser linewidth which may be important in many applications, i.e. coherent communications, sensing etc. The laser may be fabricated using a generic and commercially available Indium Phosphide, InP, photonic integration technology.

Other variations to the disclosed embodiments can be understood and effected by those skilled in the art in practicing the claimed invention, from a study of the drawings, the disclosure, and the appended claims, In the claims, the word "Comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope thereof.

What is claimed is:

1. A tunable ring laser having a ring cavity, wherein the ring cavity comprises:
   a ring resonator having a waveguide;
   a phase modulator having a waveguide;
   a power coupler coupled to the ring resonator; and
   a reflector, to reflect an anti-clock-wise mode or reflect a clock-wise mode, such that a propagation direction of a mode of the tunable ring laser is unidirectional,
   wherein a cross section of the waveguide of at least one of the ring resonator or the phase modulator is configured as an electro-refractive modulator such that the tunable ring laser is tunable by applying a reverse bias voltage to at least one of the waveguide of the ring resonator or the waveguide of the phase modulator respectively.

2. The tunable ring laser of claim 1, wherein the tunable ring laser is a monolithically integrated, indium phosphide (InP), tunable ring laser.

3. The tunable ring laser of claim 2, wherein the power coupler is a multimode interference coupler.

4. The tunable ring laser of claim 2, wherein the ring resonator is a first ring resonator and the ring cavity comprises a second ring resonator.

5. The tunable ring laser of claim 2, wherein the ring cavity further comprises a semiconductor optical amplifier arranged for amplifying a light wave in the ring cavity.

6. The tunable ring laser of claim 5, wherein the semiconductor optical amplifier comprises indium gallium arsenide phosphide (InGaAsP) multi-quantum-well based material.

7. The tunable ring laser of claim 2, wherein at least one of the waveguide of the phase modulator or the waveguide of the ring resonator is an etched ridge waveguide, wherein a cross-section of the etched ridge waveguide is a vertical PIN diode and acts as an electro-refractive modulator.

8. The tunable ring laser of claim 4, wherein a circumference of the first ring resonator is different to a circumference of the second ring resonator.

9. A method of operating a tunable ring laser, wherein the method comprises:
   coupling, by a power coupler, a first light wave and a second light wave in a ring resonator;
   guiding, by the ring resonator and a phase modulator, a first light wave and a second light wave via at least one of a waveguide of the ring resonator or a waveguide of the phase modulator respectively, wherein a cross section of the waveguide of at least one of the ring resonator or the phase modulator respectively is configured as an electro-refractive modulator,
   applying, to at least one of the waveguide of the ring resonator or the waveguide of the phase modulator respectively, a reverse bias voltage to tune the tunable ring laser, and
   reflecting, by a reflector, an anti-clock-wise mode or a clock-wise mode, such that a propagation direction of a mode of the tunable ring laser is unidirectional.

10. The method of claim 9, wherein the ring resonator is a first ring resonator and the ring cavity comprises a second ring resonator.

11. The method of claim 9, wherein the cavity comprises a semiconductor optical amplifier, and wherein the method further comprises:
   amplifying, by the semiconductor optical amplifier, a light wave in the cavity.

12. The method of claim 11, wherein the semiconductor optical amplifier comprises indium gallium arsenide phosphide (InGaAsP) multi-quantum-well based material.

13. A method of fabricating a tunable ring laser having a ring cavity, the method comprising:
- at least partly providing a ring resonator having a waveguide;
- at least partly providing a phase modulator having a waveguide;
- at least partly providing a power coupler coupled to the resonator; and
- at least partly providing a reflector to reflect an anti-clockwise mode or a clock-wise mode, such that a propagation direction of a mode of the tunable ring laser is unidirectional,
- wherein a cross section of the waveguide of at least one of the ring resonator or the phase modulator is configured as an electro-refractive modulator such that the tunable ring laser is tunable by applying a reverse bias voltage to at least one of the waveguide of the ring resonator or the waveguide of the phase modulator respectively.

14. The method of claim 13, comprising at least one of: using an indium phosphide (InP) integration technology, or using a silicon technology.

15. The method of claim 13, wherein the tunable ring laser is a monolithically integrated, indium phosphide (InP), tunable ring laser.

16. The method of claim 15, wherein at least one of the waveguide of the phase modulator or the waveguide of the ring resonator is an etched ridge waveguide, wherein a cross-section of the etched ridge waveguide is a vertical PIN diode and acts as an electro-refractive modulator.

17. The method of claim 15, wherein at least one of:
- the one or more power coupler is a multimode interference coupler;
- the ring resonator is a first ring resonator, and the method comprises at least partly providing a second ring resonator;
- the ring resonator is a first ring resonator, and the method comprises at least partly providing a second ring resonator with a circumference different to a circumference of the first ring resonator;
- the method comprises at least partly providing a semiconductor optical amplifier arranged for amplifying a light wave in the ring cavity; or
- the method comprises at least partly providing a semiconductor optical amplifier arranged for amplifying a light wave in the ring cavity, the semiconductor optical amplifier comprising indium gallium arsenide phosphide (InGaAsP) multi-quantum-well based material.

* * * * *